(12) United States Patent
Okazaki et al.

(10) Patent No.: US 7,943,903 B2
(45) Date of Patent: May 17, 2011

(54) DEFECT INSPECTION METHOD AND ITS SYSTEM

(75) Inventors: Shinji Okazaki, Saitama (JP); Shoji Hotta, Delmar, NY (US); Yasunari Sohda, Kawasaki (JP); Yoshinori Nakayama, Sayama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 284 days.

(21) Appl. No.: 12/320,574

(22) Filed: Jan. 29, 2009

(65) Prior Publication Data
US 2009/0206252 A1    Aug. 20, 2009

(30) Foreign Application Priority Data

Feb. 18, 2008    (JP) ................................ 2008-035863

(51) Int. Cl.
*H01J 37/153* (2006.01)
*G01N 23/00* (2006.01)
(52) U.S. Cl. ........ 250/306; 250/307; 250/310; 250/311; 250/396 R; 250/492.22; 250/492.2
(58) Field of Classification Search .................. 250/306, 250/307, 310, 311, 396 R, 492.22, 492.2; 382/145
See application file for complete search history.

(56) References Cited

U.S. PATENT DOCUMENTS

| | | | | |
|---|---|---|---|---|
| 5,430,292 A * | 7/1995 | Honjo et al. | ................... | 250/310 |
| 6,782,337 B2 * | 8/2004 | Wack et al. | ................... | 702/155 |
| 6,799,130 B2 | 9/2004 | Okabe et al. | | |
| 7,231,079 B2 | 6/2007 | Okuda et al. | | |
| 2009/0146057 A1 * | 6/2009 | Sohda et al. | ................... | 250/311 |
| 2009/0232385 A1 * | 9/2009 | Matsuoka et al. | ............ | 382/145 |

OTHER PUBLICATIONS

Norihiko Miyazaki, et al., "Design for Manufacturability Production Management Activity Report", Proc. of SPIE, vol. 6283, pp. 628302-1-628302-10, (2006).

* cited by examiner

*Primary Examiner* — Nikita Wells
(74) *Attorney, Agent, or Firm* — Stites & Harbison PLLC; Juan Carlos A. Marquez, Esq.

(57) ABSTRACT

A method for enabling management of fatal defects of semiconductor integrated patterns easily, the method enables storing of design data of each pattern designed by a semiconductor integrated circuit designer, as well as storing of design intent data having pattern importance levels ranked according to their design intents respectively. The method also enables anticipating of defects to be generated systematically due to the characteristics of the subject exposure system, etc. while each designed circuit pattern is exposed and delineated onto a wafer in a simulation carried out beforehand and storing those defects as hot spot information. Furthermore, the method also enables combining of the design intent data with hot spot information to limit inspection spots that might include systematic defects at high possibility with respect to the characteristics of the object semiconductor integrated circuit and shorten the defect inspection time significantly.

15 Claims, 9 Drawing Sheets

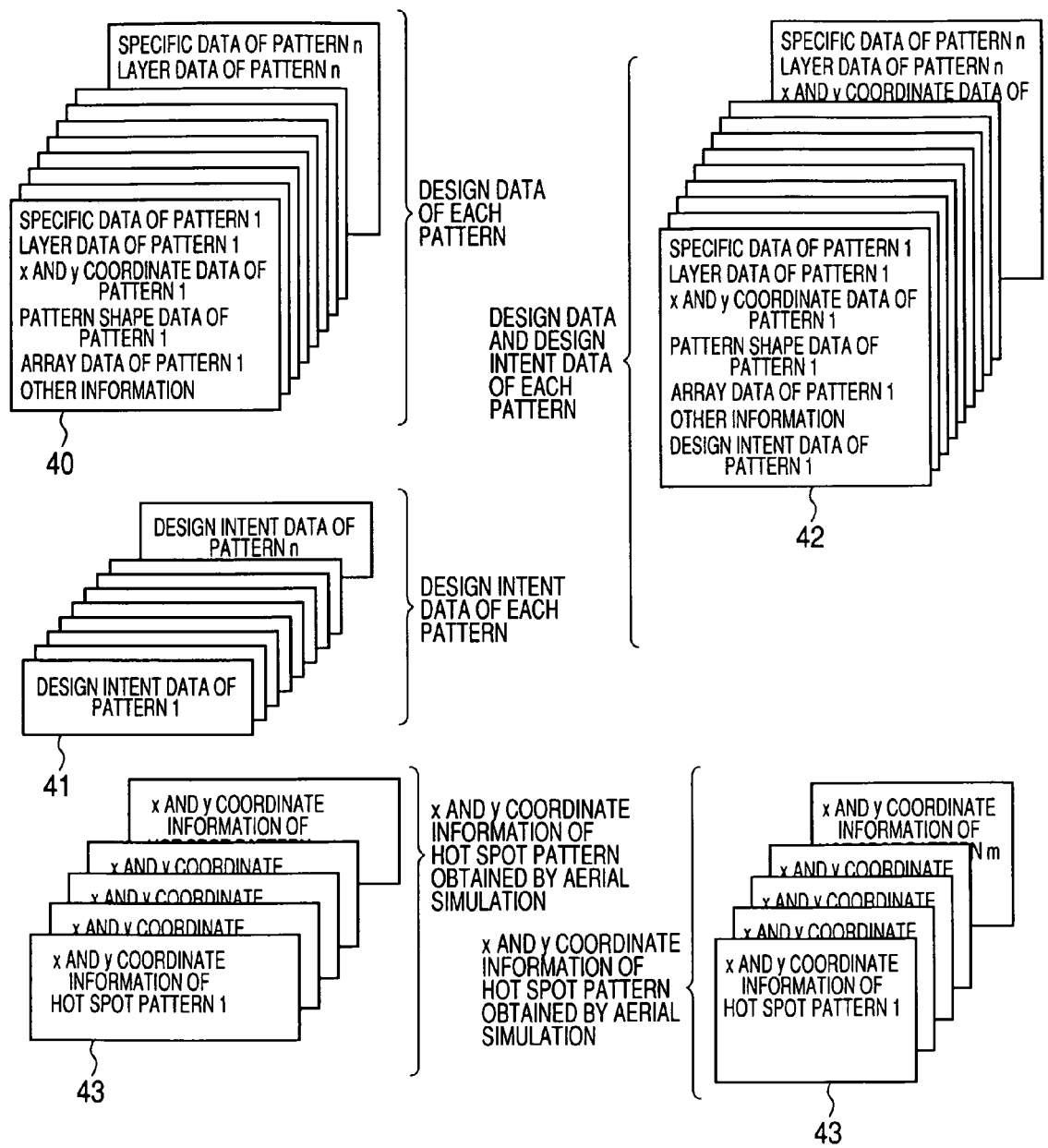

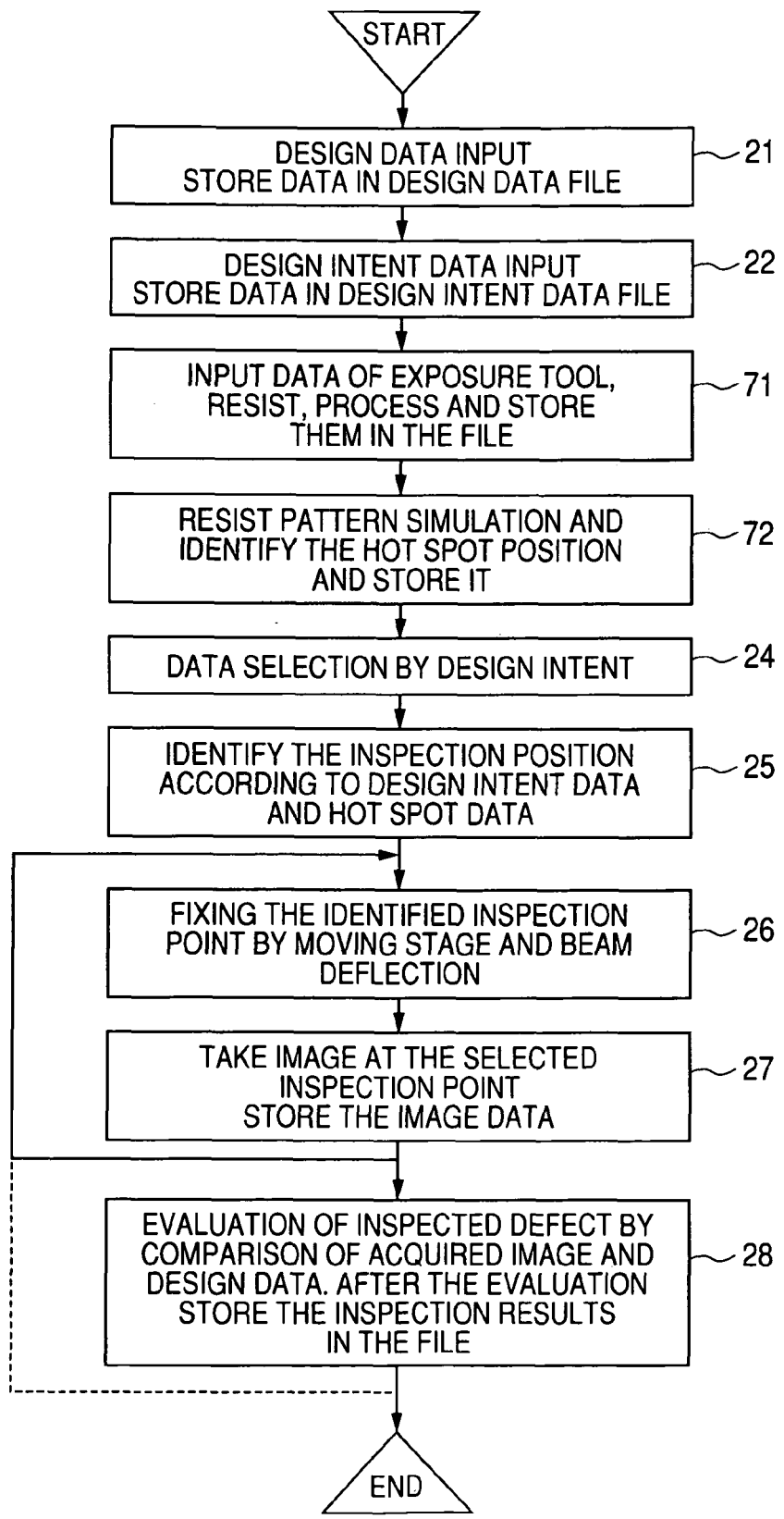

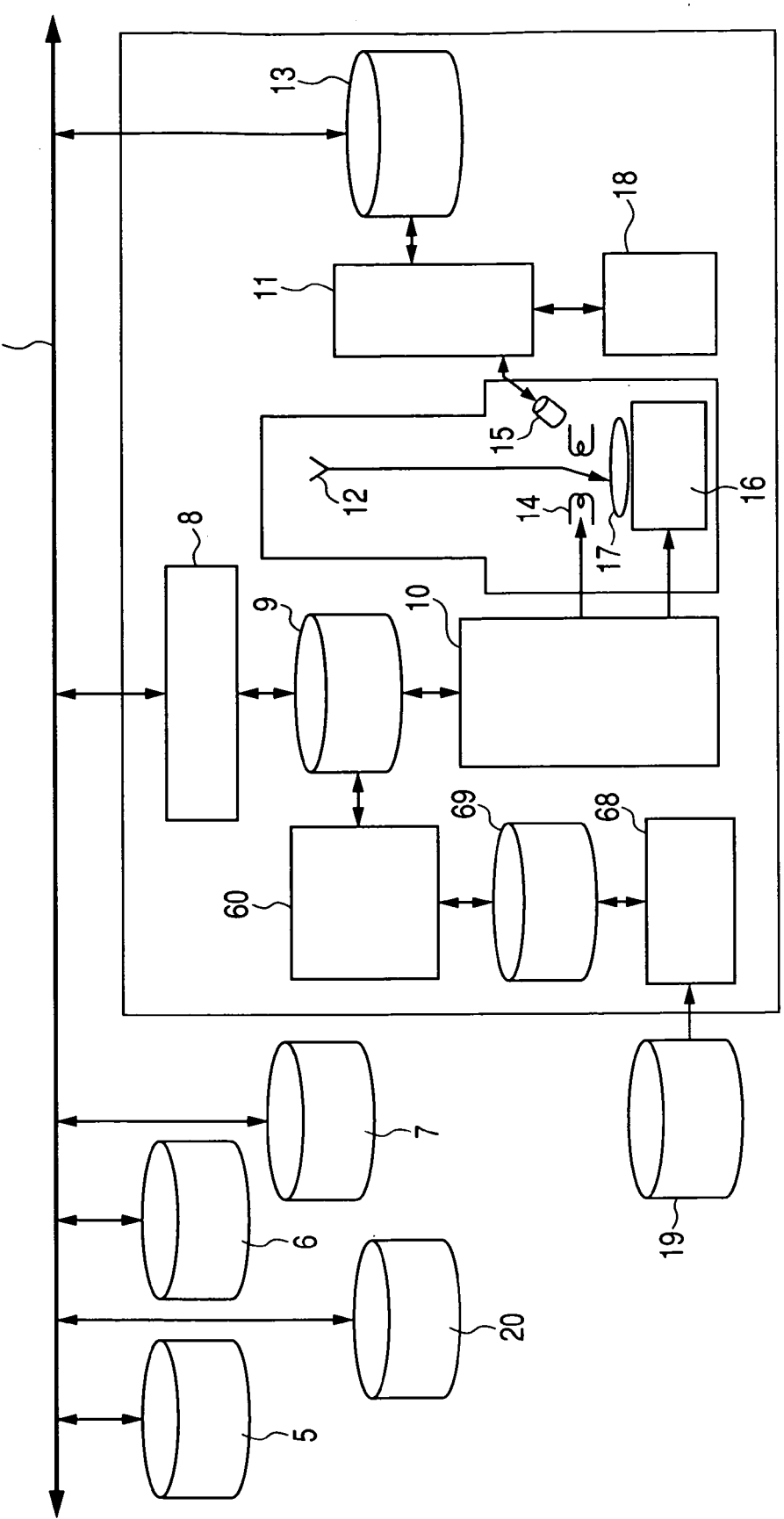

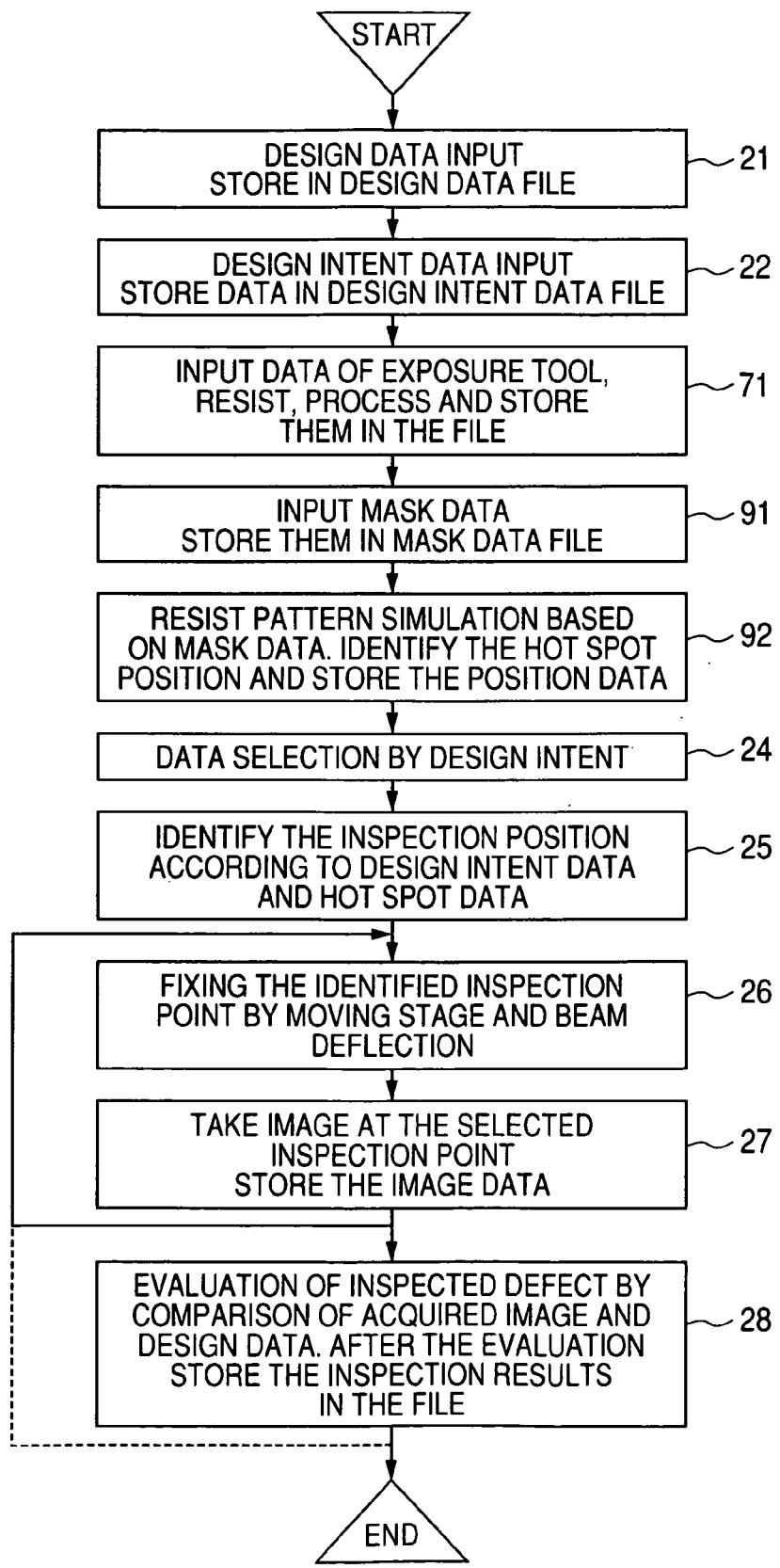

DEFECT INSPECTION METHOD AND ITS SYSTEM

CLAIM OF PRIORITY

The present application claims priority from Japanese patent application JP 2008-035863 filed on Feb. 18, 2008, the content of which is hereby incorporated by reference into this application.

FIELD OF THE INVENTION

The present invention relates to a method for inspecting defects of integrated circuit patterns formed on semiconductor substrates or the like and a system that employs the method.

BACKGROUND OF THE INVENTION

Along with the progress of the techniques of semiconductor integrated circuits that are required of higher integration and more enhanced functions, the semiconductor circuit elements have also been reduced in size while the number of those elements has remarkably increased. Furthermore, now that such semiconductor integrated circuits have come to be used widely in various fields, the number of those product types has also increased. Under such circumstances, in order to meet such demands of more miniaturizing, higher integrating, and flexible manufacturing techniques, it has also been required to carry out accurate inspections in processes, prevent generation of defective products, and grasp how those defective products are generated accurately so as to shorten the development period and keep high yields for forming those semiconductor integrated circuits. And recently, it is reported that the main factors that generate such defects of semiconductor integrated circuits have been changed from those to be caused at random by foreign matters, etc. to so-called systematic defects to be caused by imperfect resolution of exposure systems and reduction of process latitudes that cannot cope with the advancement of the miniaturization of semiconductor integrated circuits. As a result, in many cases, it has come to be possible to anticipate the manufacturing divisions that might generate such defects in the designing stage.

This means that there has occurred a problem that designed patterns cannot be delineated faithfully as they are designed due to the limited resolution in the optical lithography that delineates designed patterns actually on wafers and a phenomenon referred to as the optical proximity effects. And in order to avoid such problems, the optical proximity correction (OPC) technique that corrects the deformed patterns due to optical proximity effect has come to be employed in many cases. In spite of this, there are still some well-known problems, one of which is a problem that causes such defects to occur in specific shapes of specific patterns due to the specific shapes of those patterns, characteristics of the subject exposure system, and errors in the exposure conditions. Those defects are referred to as systematic defects and distinguished from conventional random defects that occur at random due to foreign matters, etc. as described above. And spots in which such systematic defects occur, particularly those that affect the production yield, are referred to as hot spots.

There are two conventional methods for inspecting defects of semiconductor integrated circuit patterns as described above; die to die method and die to data base method. The die-to-die method makes a comparison between patterns formed on two chips and if there is a difference between the pattern shapes, existence of a defect is determined. The die to data base method makes a comparison between an original design pattern and another actually formed pattern and if there is a difference between them, existence of a defect is determined. The former method is effective for inspecting random defects to be caused by foreign matters, etc. and employed widely. On the other hand, the latter method is usually employed for inspecting systematic defects to be caused by defects and errors that depend on mask manufacturing, exposure systems, and exposure methods. The latter method is also effective for inspecting hot spots.

On the other hand, the problem that the defect inspecting time increases significantly is considered to be very serious not only in the mask inspection, but also in the inspection of patterns on semiconductor integrated circuits. In order to cope with such problems, N. Miyazaki et al., "Design For Manufacturability Production Management Activity Report", JEITA, DFM-Production Management Sub-committee in Semiconductor Manufacturing Technology Committee for Japan, Proc. of SPIE Vol. 6283, 628302-1, 2006 discloses a method that switches among defect inspection methods to narrow inspection objects by using design intents in a mask inspection process.

SUMMARY OF THE INVENTION

Patterns to be formed on semiconductor integrated circuits that have been highly integrated and highly enhanced in function are all necessary, but they play significantly different roles respectively. For example, in case of the circuit patterns formed on the semiconductor integrated circuit shown in FIG. 3, the quick clock frequency sending lines and the signal lines (pattern 1) are used to manage delay times and send fast signals, so their resistances, parasitic capacitances, etc. are required to be managed accurately. However, in order to prevent each of these signal lines from noise, a shield line is also laid together. Furthermore, there are also ground lines used to assure the ground potential (pattern 2). And there is also a line that is not affected by any signal delay at all. In such a way, while some patterns are meaningless electrically, others are used to control signals and potentials, thereby meaningful electrically. For example, in case of the chemical mechanical polishing (CMP) technique employed widely in multilayer wiring processes in recent years, the CMP speed is often varied among pattern densities. And even in case of the optical lithography, the pattern size comes to be varied if the density is not in uniform among patterns due to the stray light in the optical system. This is referred to as a flare problem. And in order to solve those problems, dummy patterns are often used as shown in FIG. 3 to fix the density in each pattern area. This dummy pattern is completely meaningless electrically.

Patterns formed on such a semiconductor integrated circuit play designed roles (design intents) respectively and those roles are known only by the designer; nobody other than the designer can understand the roles, as well as their data of the patterns on the semiconductor integrated circuit. And in order to change such a situation, there has been proposed a data structure. In this data structure, the function (design intent) of each pattern, which is grasped by the designer, is given to the pattern itself.

In case of the inspection for the systematic defects and hot spots by the conventional die to data base method as described above, however, inspections are carried out for all the data of each specific pattern in uniform to detect specific defective shapes in the pattern. Thus all the patterns in the subject semiconductor integrated circuit come to be inspected;

thereby the number of patterns to be inspected increases and the inspection time is extended more and more due to the progress of the miniaturization of those patterns. Those problems are not improved at all by the conventional technique.

Under such circumstances, it is an object of the present invention to provide a method for inspecting semiconductor patterns and an inspection system that employs the inspection method. The method and system can realize both of the improvement of inspection accuracy and the reduction of inspection time.

In order to achieve the above object, the present invention classifies semiconductor patterns to be inspected into a plurality of pattern types as follows; patterns that require highly accurate inspection, patterns that require ordinary accuracy inspection, patterns that require no specially accurate inspection, and patterns that require no inspection. Furthermore, the present invention changes the inspection level for each type inspection object patterns according to the designer's design intent and combines the inspection method with another method for identifying each hot spot where patterns are apt to be deformed in the pattern delineate process so as to limit the number of inspection objects, and changes the inspection accuracy level for each type patterns according to the designer's intent as described above, thereby improving the inspection efficiency and reducing the inspection time significantly.

As described above, many of the defects of semiconductor integrated circuits are not conventional random defects to be caused by foreign matters and defective processes; they are often systematic defects that depend significantly on designs. And occurrence of those systematic defects can be anticipated and their positions and shapes can be narrowed beforehand in the design stage. Furthermore, as described above, semiconductor integrated circuit patterns have their specific functions respectively, so they should not be inspected on the same level. This is why the present invention uses the design intent data to classify object circuit patterns so as to carry out highly accurate inspections for patterns that require such highly accurate inspection and simple and easy inspections for patterns that require not-so-strict inspections quickly according to less strict inspection criteria. And no inspections are carried out for patterns that require no inspections, thereby reducing the inspection time.

According to the present invention provided with a function for storing a design pattern and a pattern group to be assumed as candidates of hot spots and a function for storing a design intent corresponding to each design pattern, therefore, it is possible to put the importance level of each pattern, each pattern that might generate a systematic defect at a high possibility, and a pattern group one upon another to reduce the number of inspection spots.

The inspection system of the present invention can also have functions for inputting every pattern information instead of hot spot candidate information and selecting a pattern and a pattern group to be assumed as hot spot candidates from the inputted information, then combining the selected pattern and pattern group with the subject design intent data, thereby selecting an inspection object pattern.

The present invention can thus provide an inspection method and an inspection system that can improve the inspection efficiency and reduce the inspection time while the types and the number of pattern defects are increasing rapidly along with the progress of miniaturizing and highly integrating techniques for semiconductor integrated circuit patterns.

BRIEF DESCRIPTION OF THE DRAWINGS

FIG. 4 is data format examples in the first embodiment;

FIG. 7 is a flowchart of the inspection procedures carried out by the inspection system in the second embodiment;

FIG. 8 is a block diagram of a configuration of a configuration of a semiconductor integrated circuit defect inspection system in a third embodiment; and FIG. 9 is a flowchart of the inspection procedures carried out by the inspection system in the third embodiment.

DETAILED DESCRIPTION OF THE PREFERRED EMBODIMENTS

Hereunder, there will be described the preferred embodiments of the present invention with reference to the accompanying drawings.

First Embodiment

Figure 1:
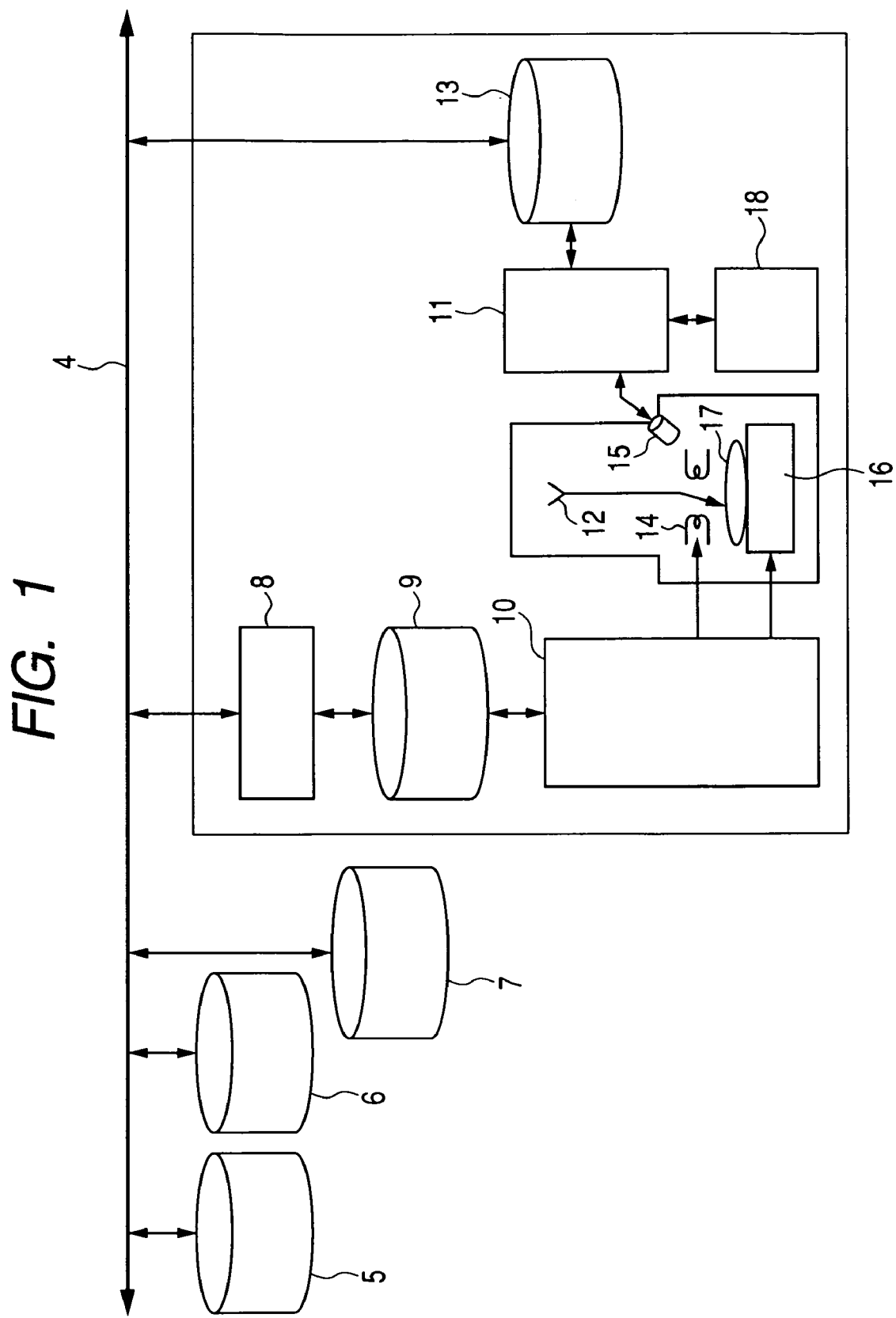
FIG. 1 is a block diagram of a configuration of a semiconductor integrated circuit defect inspection system in a first embodiment.

FIG. 1 is a block diagram of a semiconductor integrated circuit pattern defect inspection system in this first embodiment. This defect inspection system verifies semiconductor integrated circuit patterns formed on semiconductor wafers with respect to whether or not it is formed as intended by the designer by using information of top-view images obtained through measuring techniques of shapes and dimensions of those patterns.

In FIG. 1, the reference numeral 4 denotes a LAN used for the connection between a data storage unit and an inspection unit of the system. The data storage unit consists of a design data file 5, a design intent data file 6, and a hot spot (data) file 7. The inspection unit is connected to the LAN 4 through an interface 8 or the like. Other reference numerals are defined as follows; 9 denotes a buffer memory, 10 denotes a pattern selector that selects inspection object patterns in accordance with subject design intents and hot spots respectively, 11 denotes a detection signal processor that creates detection images according to detection signals respectively, and 13 denotes a detection image storage that stores detection images. This detection image storage 13 is also connected to the LAN 4. The cabinet of the inspection unit includes a charged particle beam source 12 of an electron beam or the like, a deflector 14, a signal detector 15, a wafer stage 16, etc. The wafer stage 16 mounts a wafer 17 having a semiconductor integrated circuit formed thereon. The reference numeral 18 denotes a detection signal display unit that displays detection images created according to detection signals respectively. Each of the pattern selector 10 and the detection signal processor 11 can be formed as a dedicated hardware configuration or configured of software processings to be carried out by a central processing unit (CPU) of a computer provided in the inspection unit, of course.

Figure 2:
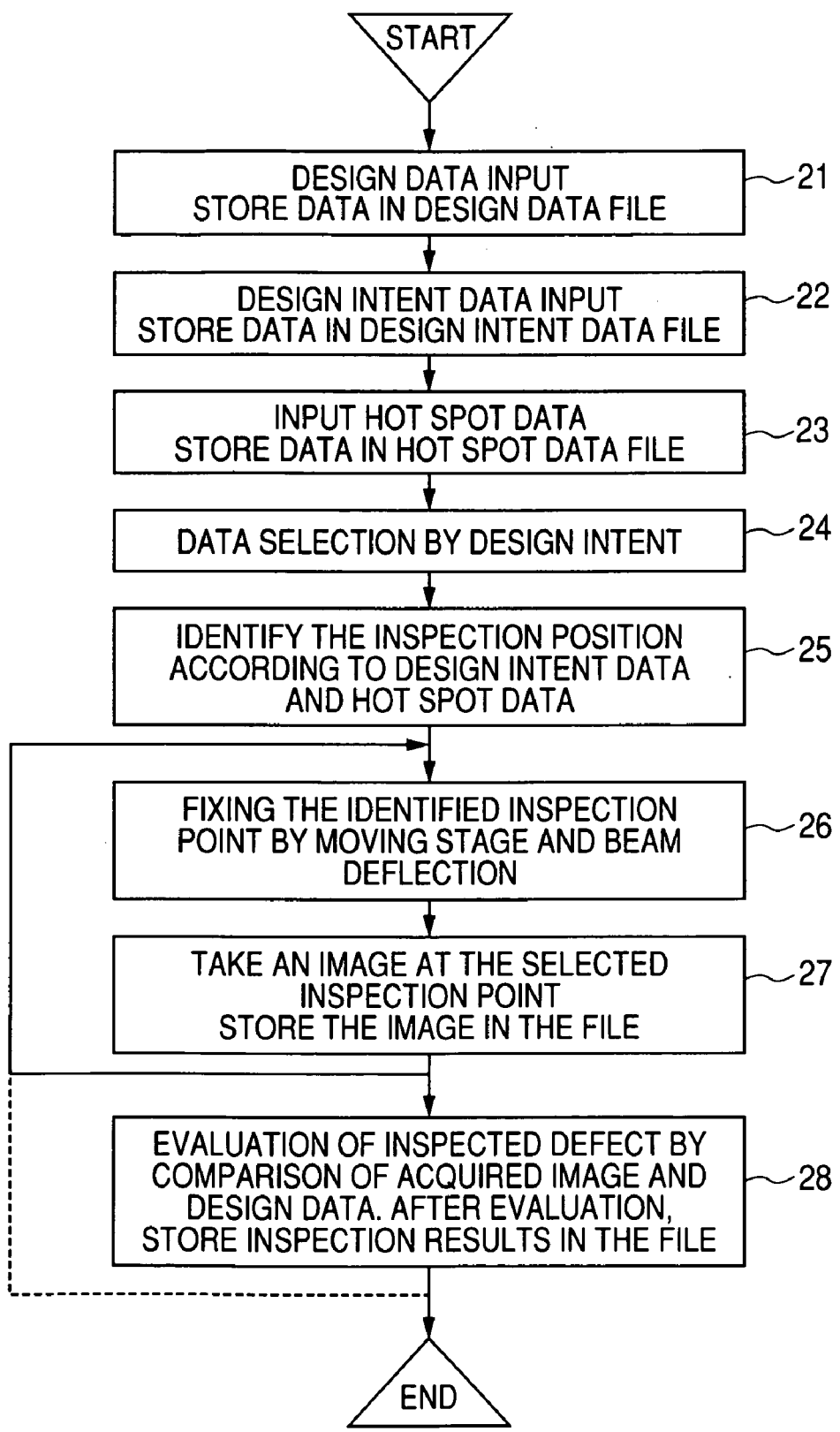
FIG. 2 is a flowchart of the inspection procedures carried out by the inspection system in the first embodiment.

Next, there will be described with reference to the inspection procedures shown in FIG. 2 how the defect inspection system in this first embodiment is to be used for verifying whether or not semiconductor integrated circuit wiring layers are formed as intended by the designer according to, for example, a design rule of 65 nm.

In this design example, it is premised that there are designed a signal line pattern (pattern 1) for sending signals, a shield line pattern (pattern 2) disposed near the signal line pattern, and a dummy pattern (pattern 3) disposed to fix the polishing speed in the chemical mechanical polishing (CMP) process applied for forming a multilayer wiring structure and to fix the wiring pattern area. Those patterns are stored in the design data file 5 and the design intent data file 6 respectively. The design data and the design intent data can be stored in a common file if the file format is the same between them as to be described later. Here, it is premised that the ratio among the signal line pattern (pattern 1), the shield line pattern (pattern 2), and the dummy pattern (pattern 3) is premised as 1:3:6.

Then, an exposure simulation was carried out for this circuit pattern by using an ArF scanner (NA: 0.75). As a result, it was anticipated that some hot spots would be generated. This hot spot information (data) is linked with the design data and stored in the hot spot information (data) file 7. The defect inspection system in this first embodiment accumulates/stores those design data, design intent data, and hot spot information in the buffer memory 9 through the interface 8 (steps 21 to 23) so as to be used in the system later. As described above, the inspection accuracy levels of inspection object patterns can be used as design intent data. For example, the design intent data can be classified into information denoting patterns that require highly accurate inspection, patterns that require ordinary accurate inspection, patterns that require no special accurate inspection, and patterns that require no inspection.

FIG. 4 shows concrete data format examples. The data format shown in FIG. 4A includes such information items as coordinates and shapes of patterns in the file 40. However, the data format does not include such design intent data as importance levels of patterns. The user is thus required to input those information items as an optional file 41. On the other hand, the format as shown in FIG. 4B enables such design intent data items as importance levels of patterns, etc. to be described together with those coordinates and shapes in the same file, for example, in the file 42. In any of those cases, separately from the design data and design intent data, the user is required to input the coordinates of the position of each hot spot pattern extracted from the exposure simulation result as a file 43; the inputted information is assumed as the hot spot information shown in FIGS. 4A and 4B. In this first embodiment, as described above, the positional information (data) of such a hot spot pattern is saved in the file 43. However, the user can also input the design data of every pattern and use this pattern information so as to enable the inspection system to obtain a pattern and a pattern group to be assumed as a hot spot candidate.

Using those information items stored in the buffer memory 9 provided in the inspection system, the pattern selector 10 selects an object pattern according to the design intent data and the information denoting whether or not the pattern is a hot spot to determine the priority level of the inspection for the selected pattern.

Concretely, the pattern selector 10 selects object data according to the design intent data described above (step 24) and determines the three priority levels of inspection for the hot spot pattern, the shield pattern, and the dummy pattern of the object signal line. More concretely, the conventional highly accurate inspection is carried out for the hot spot pattern, the shield pattern is checked only for presence of such fatal shape damages as short-circuit, disconnection, etc. without checking the dimensional accuracy, and no inspection is carried out for the dummy pattern. With reference to those priority levels, the pattern selector 10 selects an inspection object spot (step 25) and controls the positions of the stage and the electron beam to determine the inspection spot (step 26). The most important inspection spot such as a signal line, etc. determined in such a way is used to obtain an image in the signal detector 15 and the image is stored as an image file in the detection image storage 13 (step 27). Furthermore, the contour of this image is extracted as a pattern, which is then compared with its design pattern in the detection signal processor 11 to determine whether or not the difference between the sizes and shapes of those two patterns denotes a defect (step 28). The shield pattern of the signal line is checked only for presence of short-circuit and disconnection in the detection signal processor 11 according to the image obtained from the signal detector 15.

Although those determinations are made in an inspection process in real time, they may also be processed by using the image file stored in the image memory 13. And the comparison carried out automatically can also be made manually by the inspection worker on the screen of the display 18 that is a graphical user interface (GUI). In this case, the inspection worker makes inspection by comparing the design pattern displayed on the screen of the display 18 with the image formed according to the detection signal output from the signal detector 15.

After storing the image file obtained in step 27, control returns to step 26 where the selected spot is inspected. However, control can return to step 26 as shown with a dotted line after the defect evaluation result and the file are output in step 28. This is also true in other embodiments to be described later.

Figure 5A:
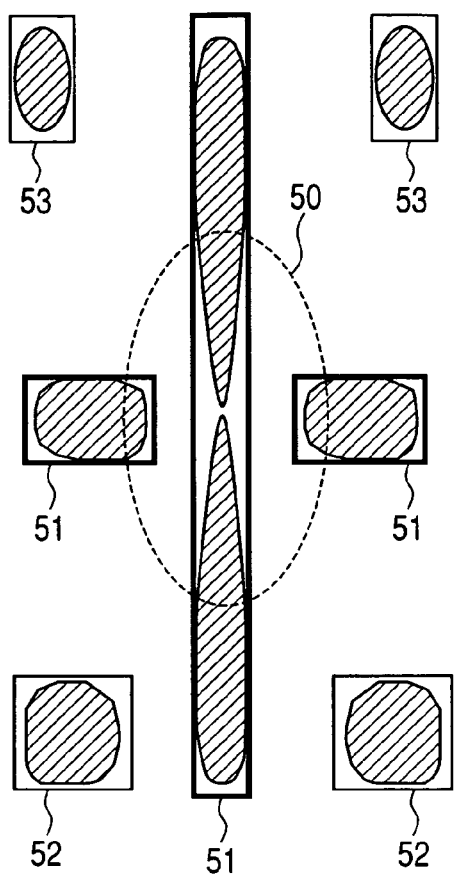
FIG. 5 is a diagram for showing examples of detection signal images displayed on the screen of an image display device (GUI) in the first embodiment.
Figure 5B:
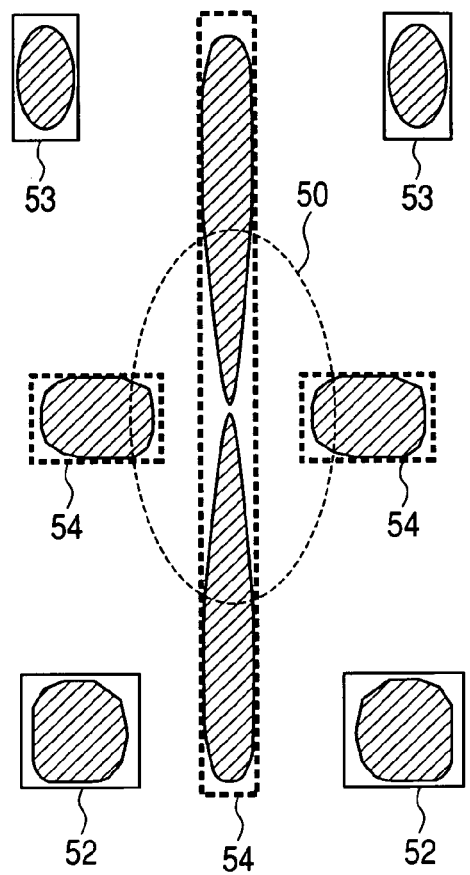

FIGS. 5A and 5B show examples of images of a semiconductor integrated circuit pattern displayed on the screen of the display 18 of the inspection system in this embodiment. As shown in FIGS. 5A and 5B, in the images, the design data patterns 51 to 54 of the coordinates of the hot spot anticipated in the simulation are put on the images (shaded portions) obtained from the signal detector 15. Here, the reference numerals are defined as follows; 50 denotes a hot spot, 51 and 54 denote patterns having design intent data of "1", 52 denotes patterns having design intent data of "2", and 53 denotes patterns having design intent data of "3". The design intent data items "1", "2", and "3" enable the inspection worker to distinguish among design intents. Concretely, as shown in FIG. 5A, the pattern 51 having a design intent of the high importance level "1" can be distinguished from the patterns 52 and 53 having design intents of importance levels "2" and "3" by using another color such as red or the like or by using a thick line on the display screen. Furthermore, as shown in FIG. 5B, the design intent of the pattern 54 having a high importance level design intent can be distinguished from others by displaying it with a dotted line or by blinking it according to the design intent data. If there are multiple importance priority levels, they can be displayed in different colors or in different blinking ways respectively. They may also be displayed according to their priority of importance levels.

In this process, the inspection worker monitored the inspection detection state on the screen of the detection signal display unit 18 as needed. According to the method carried out as described above, the inspection time was reduced by 85% more than the conventional inspection that inspected all the patterns of each object circuit.

Second Embodiment

Figure 6:
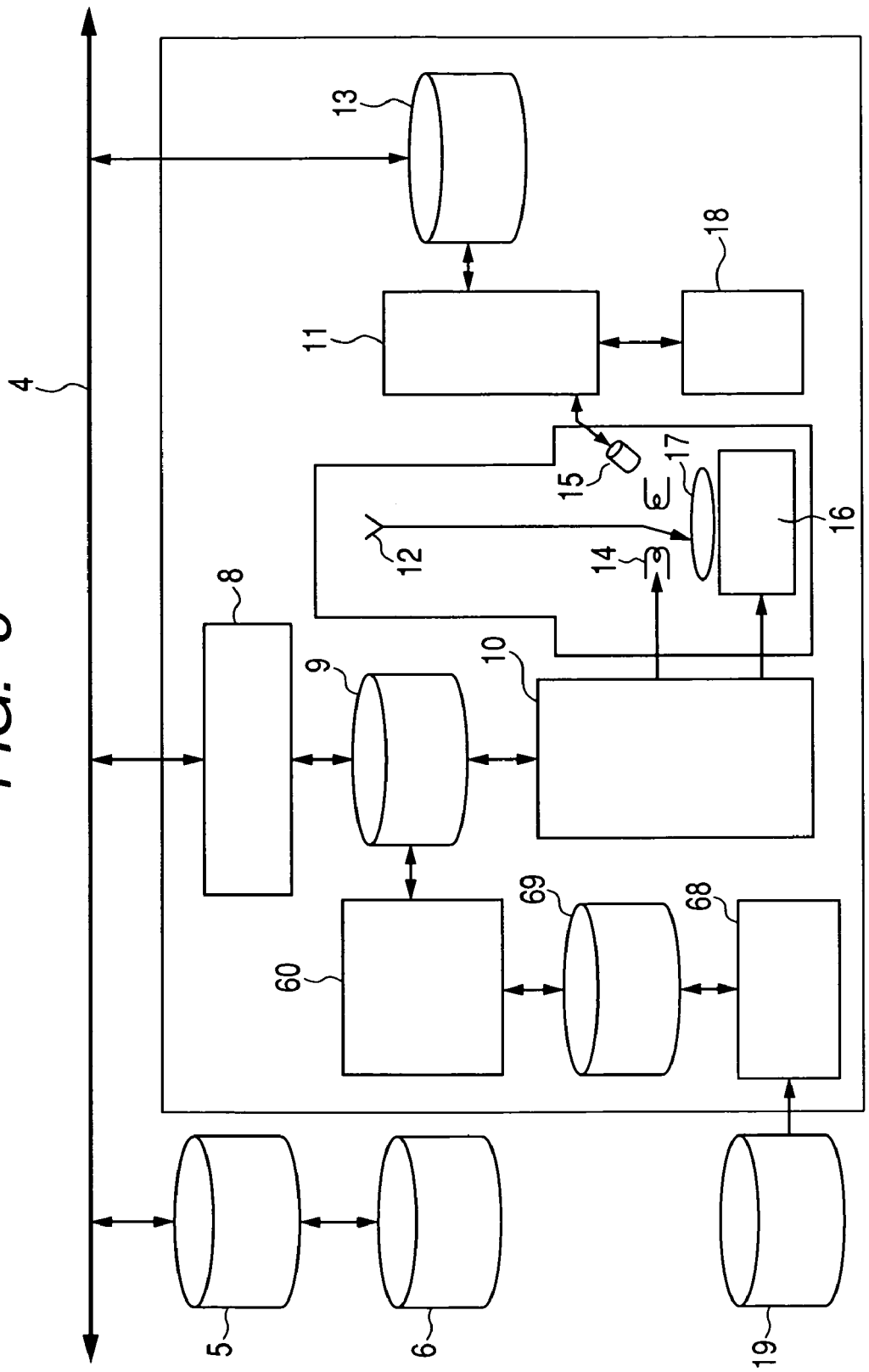
FIG. 6 is a block diagram of a configuration of a semiconductor integrated circuit defect inspection system in a second embodiment.

FIG. 6 is a block diagram of a semiconductor integrated circuit pattern defect inspection system in this second embodiment. The circuit defect inspection system in this embodiment, just like that in the first embodiment, uses information of top-view images obtained with use of measuring techniques for the shapes and sizes of patterns formed on semiconductor wafers to verify whether or not those semiconductor integrated circuit patterns are formed in accordance with the intents of the designer respectively. However, this embodiment is characterized by presence of a hot spot information extractor that calculates hot spot information from each design pattern. The extractor is built in this inspection system.

Figure 3:
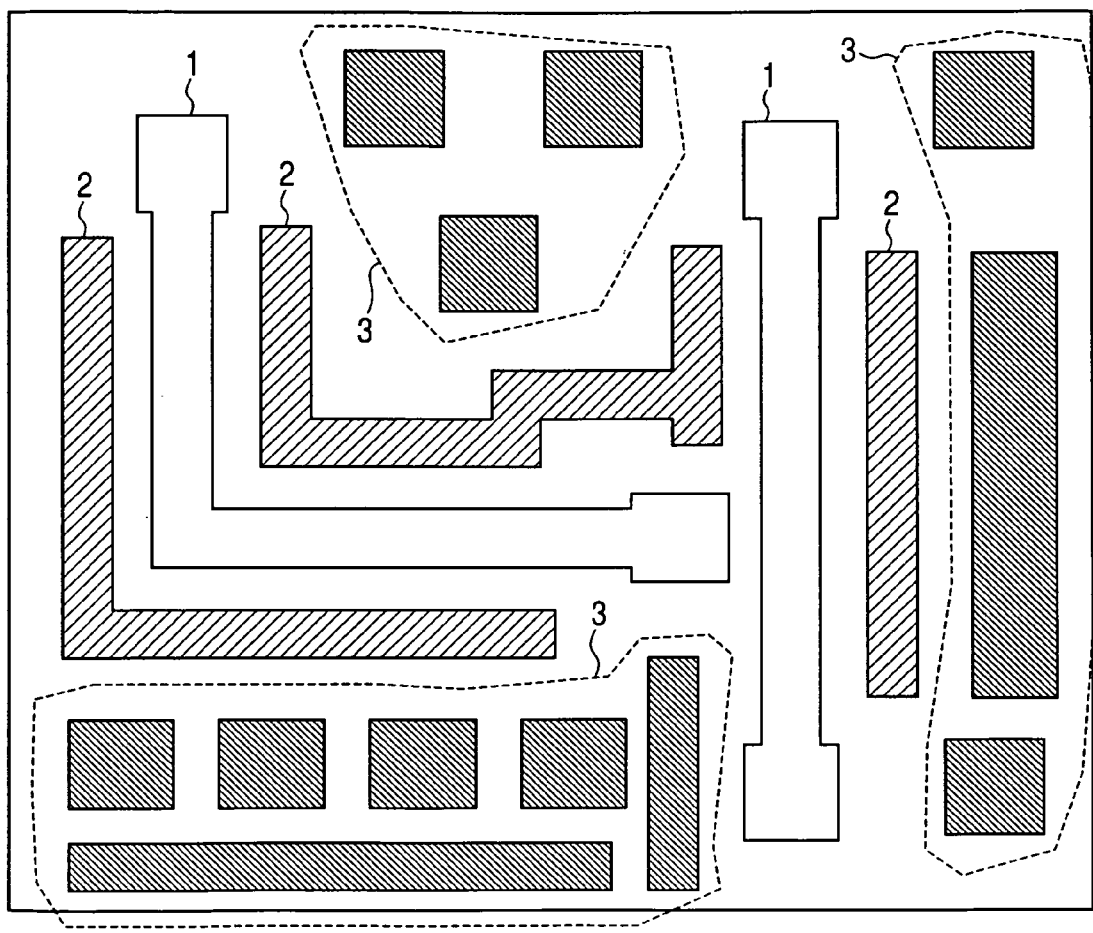
FIG. 3 is an example of a design pattern.

Next, there will be described an inspection carried out for the same wiring layer pattern as that in the first embodiment shown in FIG. 3 with use of the defect inspection system in this second embodiment. Here, the inspection procedures shown in FIG. 7 were carried out to classify patterns according to their design intents similarly to those in the first embodiment. Then, the design data 5 and the design intent data 6 were inputted to the inspection unit through the interface 8. On the other hand, the inspection unit in this second embodiment includes an interface 68 and a buffer memory 69 that accept process information 19 such as the exposure system information (system characteristics data and such data as exposure conditions, etc.), resist information, etc. respectively. The buffer memory 69 stores exposure system/resist/process data (step 71). The information extractor 60 uses those information items stored in the memory buffer 69 to simulate the exposure shape of each object design pattern and extract the object hot spot information, then stores the extracted hot spot positional information as a file in the buffer memory 69 (step 72). This extractor 60 can be configured of software processings carried out by the CPU described above. In this case, the inspection system comes to correspond flexibly to a plurality of exposure systems and cope with process changes such as material changes, etc. The inspection procedures shown in FIG. 7 are all the same as those shown in FIG. 2 except for the step 23, which is replaced with the steps 71 and 72 in FIG. 7.

As described above, the inspection system in this second embodiment can use such input information as process information, etc. including the exposure system, resist, etc. as well as the built-in functions of the hot spot information extractor 60 to select each inspection object pattern through the pattern selector 10 according to the design intent data and the information denoting whether or not the pattern is a hot spot just like in the first embodiment, then gives the pattern a priority level of the inspection differently among exposure systems.

Concretely, just like in the first embodiment, three priority levels of inspection are determined as follows for the hot spot, shield, and dummy patterns. More concretely, the conventional highly accurate inspection is carried out for the hot spot pattern of the object signal line. The shield pattern of the signal line is checked only for presence of such serious damages of the shape as short-circuit, disconnection, etc. without checking the dimensional accuracy. And no inspection is carried out for the dummy pattern. According to these priority levels, the pattern selector 10 selects an inspection object spot and controls the positions of the stage and the electron beam to limit the number of inspection spots.

Among those inspection object spots limited as described above, the most important inspection object spot such as a signal line or the like was checked according to its importance level. Concretely, a pattern obtained by extracting the contour of an image obtained from the signal detector 15 was compared with its design pattern in the detection signal processor 11 to obtain the differences between the sizes and the shapes of those two patterns, then the object pattern was checked for presence of defects according to the differences. The shield of the signal line was checked only for presence of short-circuit and disconnection according to the image obtained from the signal detector 15.

In this process, the inspection worker monitored the state of the defect detection on the screen of the detection signal display 18 as needed. As a result, it was found that the inspection time was reduced by 90% in the first exposure system and 85% in the second exposure system more than the conventional inspection that inspects all the patterns of each object circuit. In such a way, the inspection system of the present invention car reduce the inspection time appropriately to each exposure system.

Third Embodiment

FIG. 8 is a block diagram of a semiconductor integrated circuit pattern defect inspection system in this third embodiment. The circuit defect inspection system in this embodiment, just like those in the first and second embodiments, uses the top-view image information obtained by measuring the shapes and sizes of patterns formed on semiconductor wafers to verify whether or not object semiconductor integrated circuit patterns are formed in accordance with the intents of the designer respectively. However, this embodiment is characterized by using the mask information set in the information file 20 as a pattern information reference, not by using the design pattern as a reference. The mask information is stored in the buffer memory 9 through the interface 8 just like the design data and design intent data.

FIG. 9 is a flowchart of the inspection procedures in this third embodiment. In FIG. 9, the same step numbers are used for the same steps as those in FIG. 2. At first, mask information is stored as a file in the buffer memory 9 just like a design pattern (step 91). Then, the pattern selector 10 uses this mask information to calculate a resist pattern on the basis of the mask to determine a hot spot and stores the positional information of the hot spot in the buffer memory 9 (step 92). Needless to say, the pattern selector 10 includes the pattern selecting function in the first embodiment in addition to the processing functions described above. The subsequent processings are the same as those in the first and second embodiments. This third embodiment can thus reduce the number of defect detection errors to be caused by mask manufacturing errors that occur in the mask manufacturing process. As a result, the defect detection reliability is improved by 20% more than that of obtained from the system described in the second embodiment.

What is claimed is:

1. An integrated circuit pattern defect inspection method to be employed for an inspection system that inspects a circuit pattern defect by scanning a charged particle beam on a semiconductor substrate having an integrated circuit pattern formed thereon and using a detection image according to a detection signal,
   wherein the inspection system inputs design intent data of the integrated circuit pattern and gives priority to an inspection of the circuit pattern that is determined to be important according to the inputted design intent data and related to a hot spot pattern that might be deformed easily in a delineate process.

2. The integrated circuit pattern defect inspection method according to claim 1,
   wherein the inspection system also inputs the design data of the integrated circuit in addition to the design intent data.

3. The integrated circuit pattern defect inspection method according to claim 2,
wherein the inspection system extracts the hot spot pattern from the inputted design data.

4. The integrated circuit pattern defect inspection method according to claim 1,
wherein the inspection system also inputs the integrated circuit design data and the hot spot pattern positional information in addition to the design intent data.

5. The integrated circuit pattern defect inspection method according to claim 4,
wherein the inspection system selects the inspection object circuit pattern according to the inputted design intent data and hot spot position information.

6. The integrated circuit pattern defect inspection method according to claim 1,
wherein the inspection system does not inspect the circuit pattern if its importance level is determined to be low as a result of the determination carried out according to the design intent data.

7. The integrated circuit pattern defect inspection method according to claim 1,
wherein the inspection system inputs the system characteristics data and exposure condition data with respect to an exposure system used for delineating patterns together with the design data and the design intent data and obtains an object hot spot pattern by anticipating a delineated pattern by using the inputted data.

8. An integrated circuit pattern defect inspection system, which inspects an integrated circuit pattern defect by scanning an electron beam on the integrated circuit and by using a detection image according to a detection signal that has detected secondary electrons from the surface of the integrated circuit,
wherein the system includes:
an interface unit that inputs design intent data of the integrated circuit; and
an inspection pattern selection unit that determines an importance level of the circuit pattern according to the inputted design intent data and selects a hot spot pattern that is the circuit pattern determined to be important as a result of the determination of the importance level and to be easily deformed in a pattern delineate process.

9. The integrated circuit pattern defect inspection system according to claim 8,
wherein the interface unit inputs the circuit pattern design data together with the design intent data.

10. The integrated circuit pattern defect inspection system according to claim 8,
wherein the interface unit inputs the hot spot pattern positional information together with the design intent data; and
wherein the inspection pattern selection unit selects an inspection object circuit pattern by using the positional information of the inputted hot spot pattern.

11. The integrated circuit pattern defect inspection system according to claim 8,
wherein the inspection pattern selection unit does not inspect any pattern having a low importance level set in the design intent data.

12. The integrated circuit pattern defect inspection system according to claim 8,
wherein the interface unit inputs the design data, as well as the characteristic data and exposure condition data of an exposure system used for delineating patterns together with the design intent data; and
wherein the interface unit includes a hot spot data extraction unit that anticipates a delineated pattern by using the inputted characteristic data and exposure condition data of the exposure system used for delineating patterns and obtains the positional information of the hot spot pattern to be selected and inspected.

13. A defect inspection system that inspects integrated circuit pattern defects, comprising:
a deflector that scans an electron beam on the integrated circuit;
a detector that detects secondary electrons from the integrated circuit pattern and outputs a detection signal;
a detection signal processing unit that generates an image according to the detection signal;
an interface unit that inputs the design intent data of the integrated circuit pattern; and
an inspection pattern selection unit that controls so as to determine an importance level of the integrated circuit according to the inputted design intent data, then selects and inspects a hot spot pattern that is the integrated circuit pattern determined to be important as a result of the importance level determination and to be deformed easily in a pattern delineate process.

14. The integrated circuit pattern defect inspection system according to claim 13,
wherein the interface unit inputs the hot spot pattern positional information together with the design intent data;
wherein the inspection pattern selection unit selects an inspection object integrated circuit pattern by using the inputted hot spot pattern positional information.

15. The integrated circuit pattern defect inspection system according to claim 13,
wherein the interface unit inputs design data and characteristics data and exposure condition data of an exposure system used for delineating patterns together with the design intent data; and
wherein the interface unit includes a hot spot data extraction unit that anticipates a delineated pattern by using the inputted characteristic data and exposure condition data of the exposure system used for delineating patterns and obtains the positional information of the hot spot pattern to be selected and inspected.

* * * * *